United States Patent
Ma et al.

(10) Patent No.: US 10,612,159 B2
(45) Date of Patent: Apr. 7, 2020

(54) DEVICE FOR MEASURING DISTRIBUTION OF THERMAL FIELD IN CRUCIBLE

(71) Applicant: NATIONAL CHUNG SHAN INSTITUTE OF SCIENCE AND TECHNOLOGY, Taoyuan (TW)

(72) Inventors: Dai-Liang Ma, Taoyuan (TW); Tsao-Chun Peng, Taoyuan (TW); Cheng-Jung Ko, Taoyuan (TW); Bang-Ying Yu, Taoyuan (TW); Chih-Wei Kuo, Taoyuan (TW); Ying-Cong Zhao, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 1 day.

(21) Appl. No.: 15/913,980

(22) Filed: Mar. 7, 2018

(65) Prior Publication Data
US 2019/0186043 A1    Jun. 20, 2019

(30) Foreign Application Priority Data
Dec. 18, 2017    (TW) .............................. 106144326 A

(51) Int. Cl.
*C30B 29/36*    (2006.01)
*H01L 21/324*    (2006.01)
(Continued)

(52) U.S. Cl.
CPC .............. *C30B 29/36* (2013.01); *C30B 23/06* (2013.01); *C30B 29/403* (2013.01);
(Continued)

(58) Field of Classification Search
CPC ........... Y10T 117/1024; F27D 21/0014; F27D 2019/0025; G01K 1/08; C30B 29/36
See application file for complete search history.

(56) References Cited

U.S. PATENT DOCUMENTS

| 4,281,985 A | * | 8/1981 | Mee ........................ F27B 14/04 266/250 |
| 5,882,620 A | * | 3/1999 | Downey ............... C01B 32/949 423/439 |

(Continued)

FOREIGN PATENT DOCUMENTS

| CN | 202153160 U | * | 2/2012 | ............... G01K 7/06 |
| JP | 07055586 A | * | 3/1995 | ............... G01K 7/02 |

OTHER PUBLICATIONS

European Patent Office, English Computer translation of CN 202153160U (Year: 2018).*

*Primary Examiner* — Matthew J Song
(74) *Attorney, Agent, or Firm* — Schmeiser, Olsen & Watts, LLP

(57) ABSTRACT

A device for measuring distribution of thermal field in a crucible comprises a crucible comprising an upper lid, a body, a growth chamber and a material source zone; a thermally insulating material disposed outside the crucible; a movable heating component for heating the crucible; a plurality of thermocouples enclosed by insulating, high temperature resistant material and disposed in the crucible after being inserted into a plurality of holes on the upper lid to measure distribution of thermal field in the crucible. The thermocouples enclosed by insulating, high temperature resistant material are effective in measuring and adjusting temperature distribution in the crucible to achieve optimal temperature distribution for crystal growth in the crucible.

9 Claims, 6 Drawing Sheets

(51) Int. Cl.
   *C30B 29/40* (2006.01)
   *C30B 23/06* (2006.01)
   *F27D 21/00* (2006.01)
   *G01K 1/08* (2006.01)
   *F27D 19/00* (2006.01)

(52) U.S. Cl.
   CPC ........... *F27D 21/0014* (2013.01); *G01K 1/08* (2013.01); *H01L 21/324* (2013.01); *F27D 2019/0025* (2013.01); *Y10T 117/1024* (2015.01)

(56) References Cited

U.S. PATENT DOCUMENTS

| | | | |
|---|---|---|---|
| 5,968,261 A | 10/1999 | Barrett et al. | |
| 6,190,038 B1 * | 2/2001 | Kita | G01K 1/105 136/234 |
| 7,323,051 B2 | 1/2008 | Hobgood et al. | |
| 7,351,286 B2 | 4/2008 | Headrick | |
| 7,524,376 B2 | 4/2009 | Kondo et al. | |
| 8,147,991 B2 | 4/2012 | Jenny et al. | |
| 2004/0161014 A1 * | 8/2004 | Kofune | G01K 7/02 374/179 |
| 2006/0213430 A1 | 9/2006 | Jenny et al. | |
| 2007/0151510 A1 * | 7/2007 | Muhe | C30B 11/003 117/223 |
| 2008/0295764 A1 * | 12/2008 | Svensson | C30B 23/002 117/86 |
| 2011/0200833 A1 * | 8/2011 | Kamei | C30B 9/10 428/446 |
| 2012/0234231 A1 * | 9/2012 | Masuda | C30B 23/025 117/101 |
| 2016/0138185 A1 * | 5/2016 | Hori | C30B 23/06 117/86 |
| 2016/0231181 A1 * | 8/2016 | Maruko | H01L 35/02 |

* cited by examiner (A)

(B)

(A)

(B)

DEVICE FOR MEASURING DISTRIBUTION OF THERMAL FIELD IN CRUCIBLE

CROSS-REFERENCE TO RELATED APPLICATION

This non-provisional application claims priority under 35 U.S.C. § 119(a) on Patent Application No(s). 106144326 filed in Taiwan, R.O.C. on Dec. 18, 2017, the entire contents of which are hereby incorporated by reference.

FIELD OF THE INVENTION

The present invention relates to crucible devices and, more particularly, to a device for measuring distribution of thermal field in a crucible.

BACKGROUND OF THE INVENTION

Technological advancements and high standard of living together bring the trend of 3C hi-tech electronic products toward light weights, compactness and versatility. Hence, silicon carbide (SiC), III-nitrides (such as GaN, AlN), and the like are developed to become semiconductor materials for use in the manufacturing of various electronic device. In this regard, silicon carbide (SiC) and III nitrides not only has high physical strength and high chemical inertness, but also manifests excellent electronic characteristics, including hardness, high breakdown critical electric field strength, wide band gaps, high saturation drift velocity, and high thermal stability.

Semiconductor manufacturers employ physical vapor transport (PVT) and physical vapor deposition (PVD) to grow crystals from silicon carbide and III nitrides as well as manufacture chips by mass production. PVT involves subliming powder of silicon carbide (SiC) and III nitrides in a muffle heating zone and speeding up movement of the gaseous silicon carbide (SiC) and III nitrides to a seed crystal by temperature gradient to undergo crystal growth process. However, the quality of crystals grown by PVT depends on the temperature of the crystal growth process. Hence, the prior art proposes controlling the temperature of the PVT-based crystal growth process through improvement in the apparatuses used. For instance, U.S. Pat. No. 5,968,261 discloses forming a cavity in a graphite crucible and then applying a thermally insulating material to the inner surface of the cavity to increase the efficiency of dissipation of heat from the rear of a seed crystal. US20060213430 discloses changing the distance between a seed crystal and a seed holder to control conductive heat transfer between the seed crystal and the seed holder such that the conductive heat transfer dominates the effect of radiative heat transfer between the seed crystal and the seed holder. U.S. Pat. No. 7,351,286 discloses positioning a seed crystal to reduce the bend of and stress on the seed crystal. U.S. Pat. No. 7,323,051 discloses positioning a seed crystal by a porous material at the rear thereof and features a gas-phase blocking layer for reducing sublimation of the seed crystal. U.S. Pat. No. 7,524,376 discloses growing an aluminum nitride crystal with a thin-walled crucible and by PVT to reduce thermal stress. U.S. Pat. No. 8,147,991 discloses controlling efficiency of heat transfer by adjusting the position of a seed holder so as for the seed holder to fit the surface of a seed crystal right.

Improvement in thermal field distribution, as disclosed in the prior art above, is predicted by simulating the thermal field of the crystal growth environments with simulation software and thus is never free of errors. There is a difference in particle diameter distribution between raw materials (such as silicon carbide), and thus there is a difference in the thermal field between silicon carbide crystal growth experiments. For the previously mentioned reasons, the aforesaid thermal field simulation fails to evaluate the actual thermal field temperature distribution in the crucible (crystal growth furnace).

Hence, it is important for the industrial sector to develop a device for measuring distribution of thermal field in a crucible so as to measure the actual distribution of thermal field in the crucible, eliminate temperature-dependent interference with crystal growth, adjust the distribution of thermal field in the crucible, prevent material-induced or apparatus-induced interference, achieve optimal distribution of thermal field in the crucible, and thus grow high-quality crystals.

SUMMARY OF THE INVENTION

In view of the aforesaid drawbacks of the prior art, it is an objective of the present invention to provide a device for measuring distribution of thermal field in a crucible. The device comprises a crucible, a movable heating component, and a thermally insulating material and is effective in producing high-quality crystals, such as high-quality silicon carbide crystals.

In order to achieve the above and other objectives, the present invention provides a device for measuring distribution of thermal field in a crucible, comprising: a crucible comprising an upper lid, a body, a growth chamber, and a material source zone; a thermally insulating material disposed outside the crucible; a movable heating component for heating the crucible; a plurality of thermocouples enclosed by insulating, high temperature resistant material and disposed in the crucible after being inserted into a plurality of holes on the upper lid to measure distribution of thermal field in the crucible.

Thermocouples enclosed by insulating, high temperature resistant material are made of tungsten-rhenium alloys or tungsten-molybdenum alloys, because tungsten-rhenium (tungsten-molybdenum) thermocouples are not only resistant to high temperature and thermally stable, but also feature a high thermode wire fusing point of 3300° C., low vapor pressure, high readiness to oxidation, high chemical stability in non-oxidized atmosphere, huge electromotive force, high sensitivity, long-term use at a temperature of 2000° C. to 2400° C., and short-term use at a high temperature of 3000° C.

According to the present invention, a plurality of thermocouples enclosed by insulating, high temperature resistant materials is effective in measuring distribution of thermal field in a crucible (but the present invention is not limited thereto) in carbon atmosphere, measuring distribution of thermal field in the crucible (but the present invention is not limited thereto) in pressure environments of 1-100 torr, and measuring distribution of thermal field in the crucible (but the present invention is not limited thereto) in temperature environments of 1600° C. to 2300° C. According to the present invention, the insulating, high temperature resistant material is tantalum carbide (TaC), zirconium carbide (ZrC), niobium carbide (NbC) or tungsten carbide (WC). The insulating, high temperature resistant material is covered with a layer of ceramic material, such as ZrC (but the present invention is not limited thereto), to prevent the thermocouples from ending up in a failure which might otherwise happen when the thermocouples react with carbon atmosphere or undergo induction by a heating coil.

According to the present invention, the thermocouples enclosed by insulating, high temperature resistant material are disposed in the crucible after being inserted into a plurality of holes on the upper lid to measure distribution of thermal field in the crucible.

The above summary, the detailed description below, and the accompanying drawings further explain the technical means and measures taken to achieve predetermined objectives of the present invention and the effects thereof. The other objectives and advantages of the present invention are explained below and illustrated with the accompanying drawings.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Conventional silicon carbide crystal growth techniques fall under two categories: high temperature chemical vapor deposition (HTCVD) and physical vapor transport (PVT). However, according to the prior art, temperature distribution in crystal growth environments is evaluated by thermal field simulation, whereas temperature in crystal growth environments is evaluated by measuring upper and lower temperatures outside a crucible with an optical means. As a result, a problem remains unsolved, that is, although the temperature measured is useful in silicon carbide crystal growth, the actual thermal field (temperature) distribution inside the crucible cannot be evaluated.

The present invention provides a device for measuring distribution of thermal field in a crucible, characterized in that thermal field temperature distribution inside the crucible is measured with a plurality of thermocouples made of tungsten-rhenium or tungsten-molybdenum. The plurality of thermocouples made of tungsten-rhenium or tungsten-molybdenum is capable of measuring a wide range of temperatures and thus measuring the thermal field at silicon carbide growth temperature (180~2200° C.). However, it is necessary to enclose the plurality of thermocouples by protective high-temperature-resistant insulating ceramic in order to protect the plurality of thermocouples against induction from a heating coil during a temperature rising process in an RF furnace. Then, the well-protected thermocouples are inserted into a graphite crucible to measure the thermal field distribution during the process of monocrystalline growth of silicon carbide.

The tungsten-rhenium thermocouples are resistant to high temperature and thus feature thermal stability. The tungsten-rhenium thermocouples manifest advantageously high melting point (3300° C.) of thermal electrode wire, low vapor pressure, readiness to be oxidized, high chemical stability in non-oxidized atmosphere, high electromotive force, and high sensitivity. The tungsten-rhenium thermocouples feature a long-term operable temperature of 2000° C.~2400° C. and a highest operable temperature of 3000° C. However, the tungsten-rhenium thermocouples are highly susceptible to oxidation and thus produce carbides readily in carbon-containing atmosphere to not only reduce its sensitivity but also end up in a fracture. As a result, application of the prior art is restricted to inert gas environments and dry hydrogen gas environments. To overcome the aforesaid drawback, the present invention is characterized in that the thermocouples are enclosed and thus protected by high-temperature-resistant insulating ceramic (ZrC, TaC or WC) to prevent the thermocouples from ending up in a failure which might otherwise happen when the thermocouples inserted into a graphite crucible and measuring crystal growth temperature react with carbon atmosphere or undergo induction by a heating coil.

Figure 1:
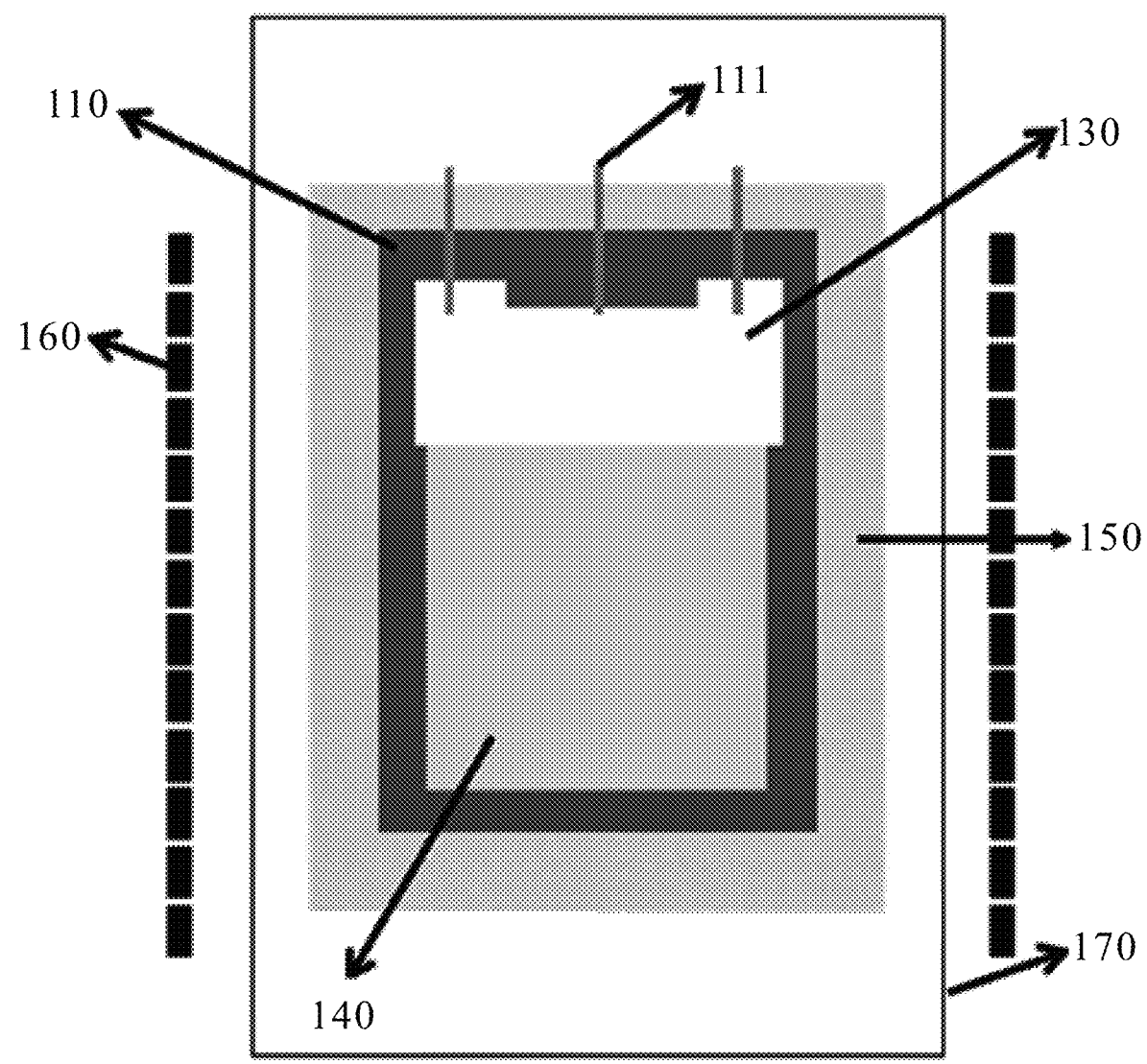
FIG. 1 is a schematic view of a device for measuring distribution of thermal field in a crucible according to the present invention.
Figure 2:
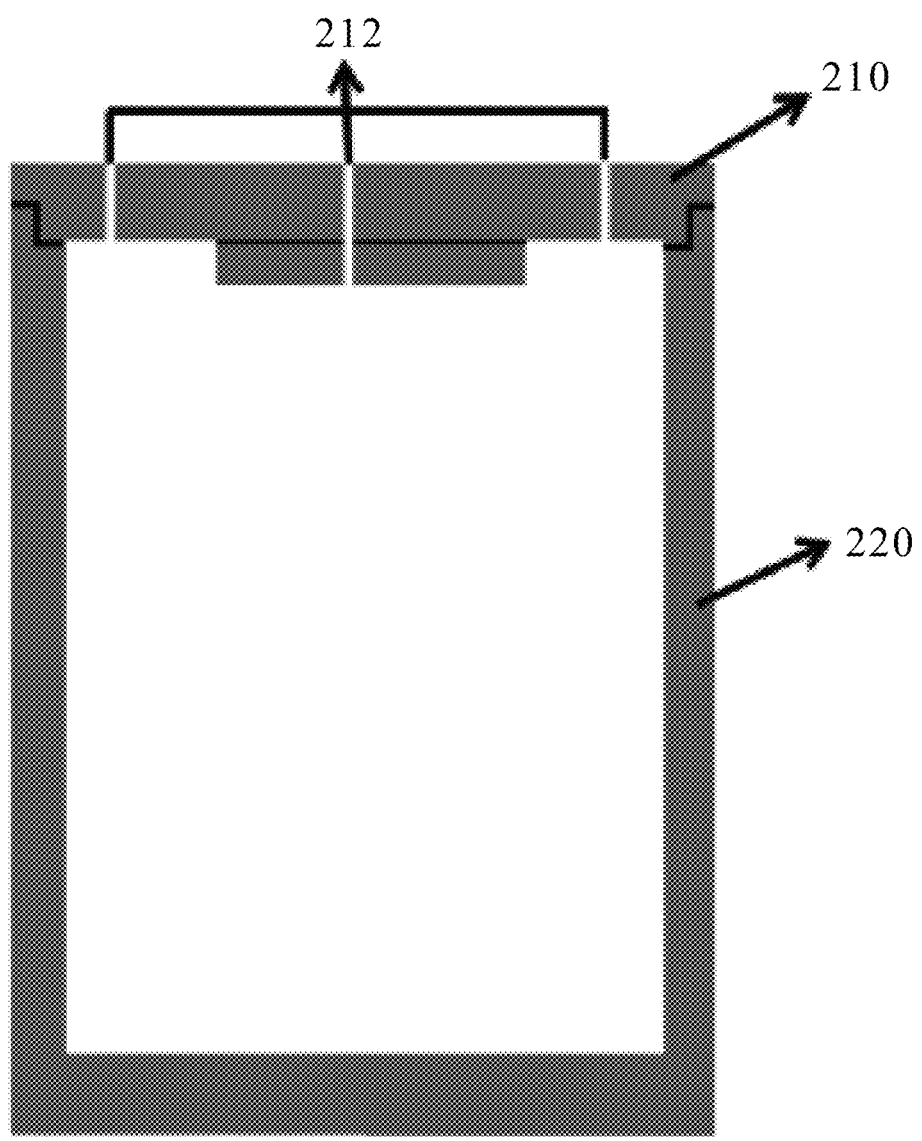
FIG. 2 is a schematic view of a crucible of the present invention.

Referring to FIG. 1, there is shown a schematic view of a device for measuring distribution of thermal field in a crucible according to the present invention. Referring to FIG. 2, there is shown a schematic view of a crucible of the present invention. As shown in the diagrams, according to the present invention, a device for measuring distribution of thermal field in a crucible comprises: a crucible 110 comprising an upper lid 210, a body 220, a growth chamber 130 and a material source zone 140; a thermally insulating material 150 disposed outside the crucible; a heating component 160 for heating the crucible; and a plurality of a thermocouple 111 enclosed by insulating, high temperature resistant material and disposed in the upper lid 210 through a plurality of holes 212 on the upper lid 210 to measure distribution of thermal field in the crucible 110.

Figure 3:
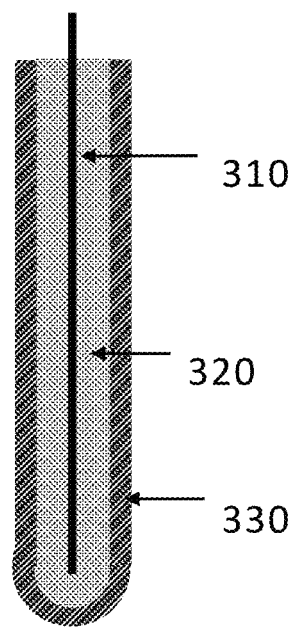
FIG. 3 is a schematic view of a thermocouple of the present invention.

Referring to FIG. 3, there is shown a schematic view of a thermocouple of the present invention. As shown in the diagram, in this embodiment, a thermocouple 310 is enclosed by a high temperature resistant material 320. The high temperature resistant material 320 is provided in the form of a protective pipe. The high temperature resistant material 320 (protective pipe) is coated with a paste which contains $ZrO_2$. The $ZrO_2$-coated protective pipe 320 is baked at 80-100° C. to dry it. Then, the protective pipe 320 is placed in a carbon-rich environment in which $ZrO_2$ reacts at high temperature and low pressure to form an insulating ceramic material 330 of ZrC, thereby producing a thermocouple protective pipe which is high temperature resistant and insulating.

In this embodiment, thermal field in a crucible for silicon carbide crystal growth is measured to evaluate thermal field distribution during the initial stage of pressure-decreased growth of silicon carbide. First, a six-inch graphite crucible body 220 is filled with silicon carbide raw material required for silicon carbide crystal growth. Then, the upper lid 210 which has holes formed thereon is rotated and tightened. Afterward, the thermocouples 111, which are well protected with high temperature resistant insulating ceramic, are inserted into holes 212, and the distance between the material source zone 140 and the thermocouples 111 is adjusted. Upon completion of the adjustment of the positions of the thermocouples 111, the temperature distribution in the growth chamber 130 can be evaluated. Afterward, the gap between each thermocouple 111 and a corresponding one of the holes 212 is sealed with graphite gel to not only provide a hermetic seal to the holes 212 but also fix the thermocouples 111 in place. Then, the graphite crucible with the thermocouples 111 therein is placed in a crystal growth furnace 170. Afterward, the crystal growth furnace 170 is subjected to vacuum suction to remove nitrogen gas and oxygen gas from the crystal growth furnace 170. Then, the temperature in the crystal growth furnace 170 is raised to 900~1250° C. Afterward, highly pure (with purity of 99.9995% or more) inert gas (argon gas, helium gas, or a mixture of argon gas and hydrogen gas) is introduced into the crystal growth furnace 170 to stay therein at constant temperature for an hour before the crystal growth furnace 170 is heated to reach a crystal growth temperature of 1800° C.~2200° C. Then, the pressure in the crystal growth furnace 170 is decreased to a pressure (1~100 torr) required for silicon carbide crystal growth which is going to take place for 1~2 hours. Then, the thermal field temperature distribution during the initial stage of silicon carbide crystal growth is measured. Upon completion of the measurement, the measurement results can be improved by moving the heating coil higher or lower to acquire appropriate distribution of thermal field in the graphite crucible. Afterward, the crystal growth furnace 170 is cooled down such that the silicon carbide crystals can be taken out of the graphite crucible. Finally, the upper lid is changed to the upper lid which has a crystal growth zone 213 fixed inside thereto, where a silicon carbide seed crystal is fixed to the crystal growth zone 213, and then it is placed in the crystal growth furnace 170 for undergoing a conventional silicon carbide crystal growth process.

Figure 4:
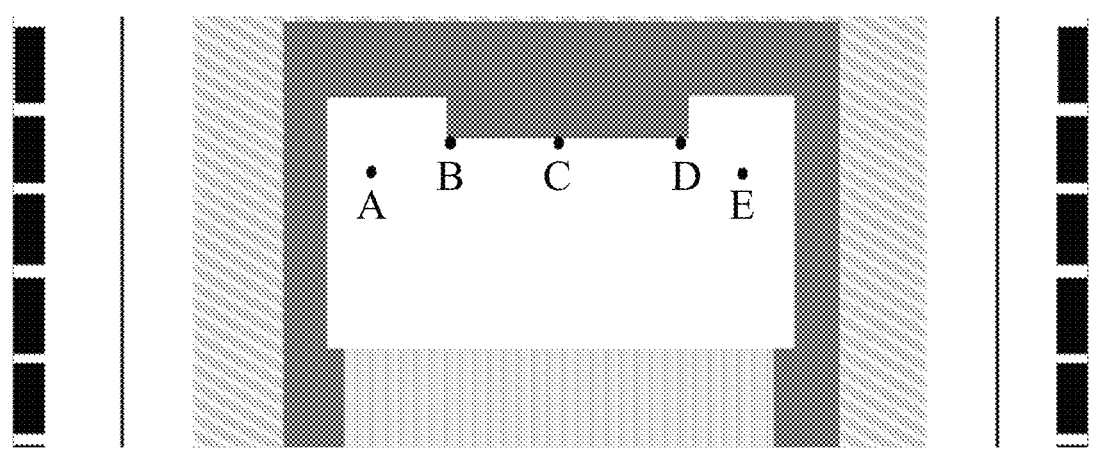
FIG. 4 is a schematic view of positions of measurement performed with the thermocouple of the present invention.
Figure 5:
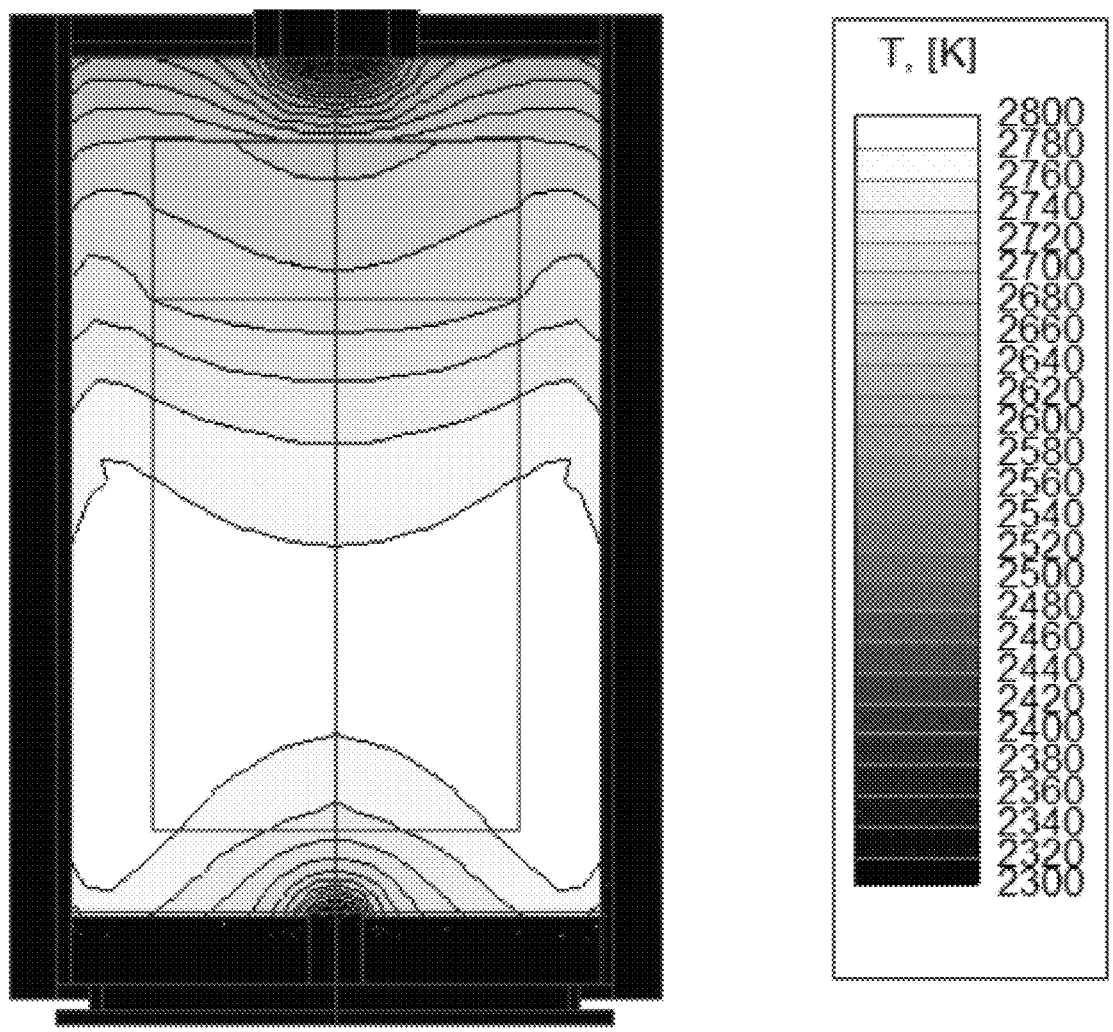
FIG. 5 is a schematic view of thermal field distribution simulation performed according to an embodiment of the present invention.
Figure 6:
FIG. 6 is a picture taken of six-inch silicon carbide crystal (A) grown under thermal field simulation conditions according to the present invention and x-ray topographic (XRT) imaging (B) thereof.
Figure 6:
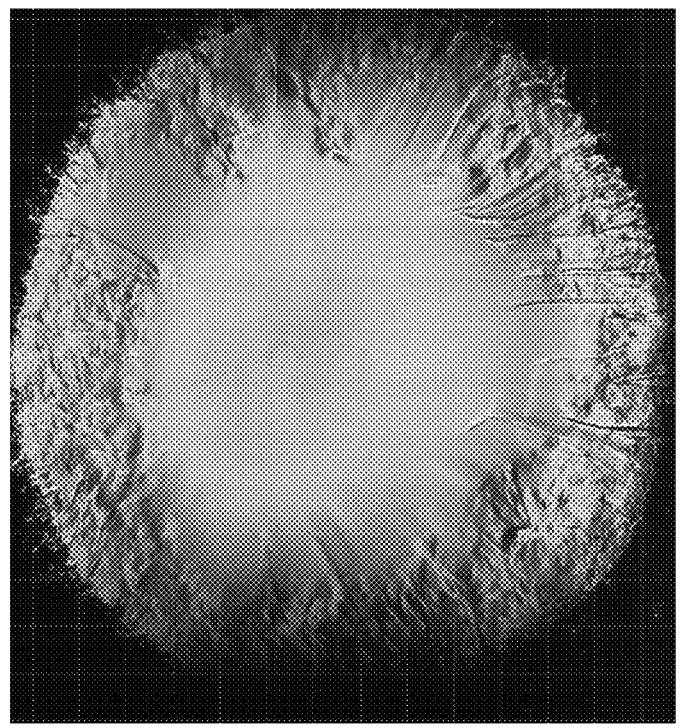
Figure 7:
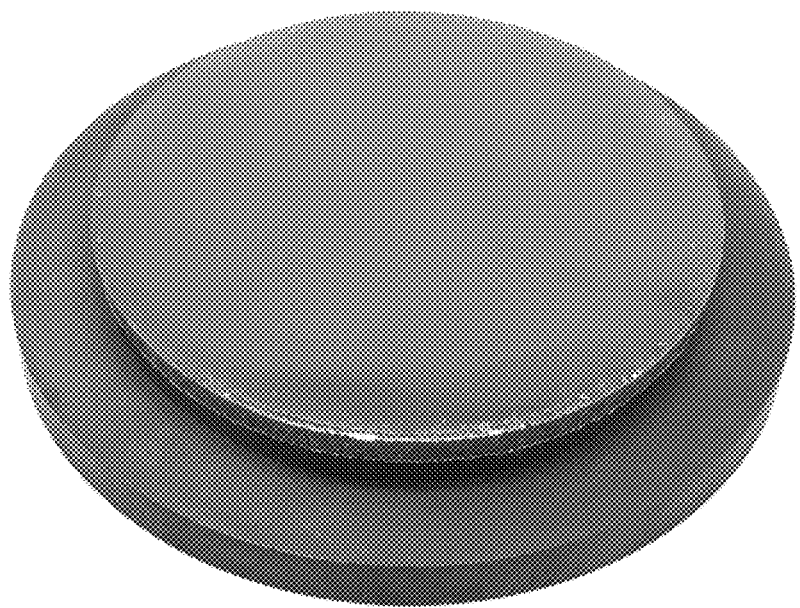
FIG. 7 is a picture taken of six-inch silicon carbide crystal (A) grown under thermal field distribution conditions according to the present invention and x-ray topographic (XRT) imaging (B) thereof.
Figure 7:
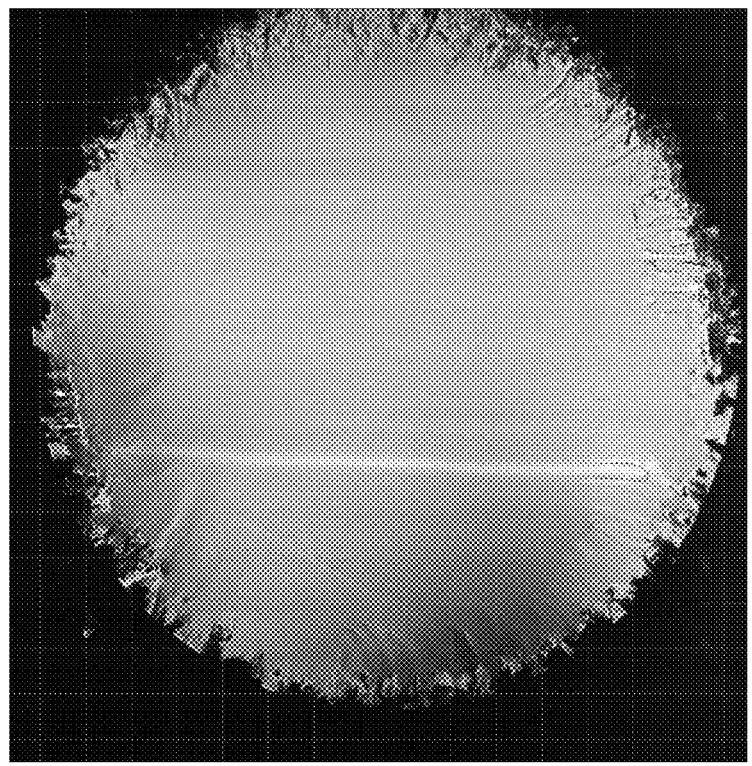

Referring to FIG. 4, there is shown a schematic view of positions of measurement performed with the thermocouple of the present invention. Referring to FIG. 5, there is shown a schematic view of thermal field distribution simulation performed according to an embodiment of the present invention. As shown in the diagrams, regarding measurement of the thermal field distribution by the thermocouple during the initial stage of silicon carbide crystal growth, points A and E are the temperature of the growth chamber, and points B, C, and E are the temperature of the crystal growth zone. The actual temperatures measured at points A, B, C, D, E are 2465 K, 2420 K, 2405 K, 2422 K, 2467 K, respectively. As revealed by the diagrams, although the position of the heating coil remains unchanged, the results of thermocouple-based measurement of temperature distribution differ from the results of temperature distribution evaluated by thermal field simulation because: (1) tolerance occurs during a processing process of the graphite crucible; and (2) owing to various distribution of particle diameters of the silicon carbide raw material, material source porosity is different from the one predefined for simulation, and thus the actual temperature is different from the simulation temperature. Referring to FIG. 6, there is shown a picture taken of six-inch silicon carbide crystal (A) grown under thermal field simulation conditions according to the present invention and x-ray topographic (XRT) imaging (B). Referring to FIG. 7, there is shown a picture taken of six-inch silicon carbide crystal (A) grown under thermal field distribution conditions according to the present invention and x-ray topographic (XRT) imaging (B) thereof. As shown in the diagrams, the six-inch silicon carbide crystal grown under thermal field simulation conditions has the following features: polycrystalline silicon carbide extends from the periphery of the six-inch crystal to the center thereof, and thus available monocrystalline region becomes smaller; x-ray topographic (XRT) imaging shows that sectioned silicon carbide crystal is of poor quality, whereas it is feasible to obtain high-quality six-inch silicon carbide crystal by confirming the thermal field distribution with the thermocouples and then conducting the silicon carbide crystal growth experiment, not to mention that XRT imaging reveals that the sectioned silicon carbide crystal is of high quality The above embodiments are illustrative of the features and effects of the present invention rather than restrictive of the scope of the substantial technical disclosure of the present invention. Persons skilled in the art may modify and alter the above embodiments without departing from the spirit and scope of the present invention. Therefore, the scope of the protection of rights of the present invention shall be defined by the appended claims.

What is claimed is:

1. A device for measuring distribution of thermal field in a crucible, comprising:
    a crucible comprising an upper lid, a body, a growth chamber and a material source zone;
    a crystal growth zone fixed inside the upper lid;
    a thermally insulating material disposed outside the crucible;
    a movable heating component for heating the crucible;
    a plurality of thermocouples enclosed by insulating material and disposed in the crystal growth zone after being inserted into a plurality of holes on the upper lid to measure distribution of thermal field in the crucible; and
    a graphite gel sealing a gap between each thermocouple and a corresponding one of the holes.

2. The device of claim 1, wherein the plurality of thermocouples enclosed by insulating, high temperature resistant material is made of one of tungsten-rhenium alloys and tungsten-molybdenum alloys.

3. The device of claim 1, wherein the insulating, high temperature resistant material is one selected from the group consisting of tantalum carbide (TaC), zirconium carbide (ZrC), niobium carbide (NbC) and tungsten carbide (WC).

4. The device of claim 1, wherein the insulating, high temperature resistant material is covered with a layer of ceramic material.

5. The device of claim 4, wherein the ceramic material is ZrC.

6. The device of claim 1, wherein the plurality of thermocouples enclosed by insulating, high temperature resistant material are inserted into holes on the upper lid to enter the crucible and thereby measure distribution of thermal field in the crucible.

7. The device of claim 1, wherein the plurality of thermocouples enclosed by insulating, high temperature resistant material measures distribution of thermal field in the crucible in a pressure environment of 1-100 torr.

8. The device of claim 1, wherein the plurality of thermocouples enclosed by insulating, high temperature resistant material measures distribution of thermal field in the crucible in a temperature environment of 1600-2300° C.

9. The device of claim 1, wherein the plurality of thermocouples enclosed by insulating, high temperature resistant material measures distribution of thermal field in the crucible in a silicon carbide atmosphere.

\* \* \* \* \*